US012787451B2

(12) United States Patent
Hsu et al.

(10) Patent No.: US 12,787,451 B2
(45) Date of Patent: Nov. 3, 2026

(54) PROTECTION OF INTEGRATED CIRCUIT FROM ESD AND PID RISKS

(71) Applicant: Taiwan Semiconductor Manufacturing Company, Ltd., Hsinchu (TW)

(72) Inventors: Chia-Lin Hsu, New Taipei City (TW); Ching-Yun Chang, Hsinchu City (TW); Yu-Ti Su, Hsinchu City (TW); Kuo-Ji Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 316 days.

(21) Appl. No.: 18/743,979

(22) Filed: Jun. 14, 2024

(65) Prior Publication Data

US 2025/0386599 A1 Dec. 18, 2025

(51) Int. Cl.
*H10D 89/60* (2025.01)

(52) U.S. Cl.
CPC .................................. *H10D 89/811* (2025.01)

(58) Field of Classification Search
CPC .. H10D 89/811; H10D 89/611; H10D 89/819; H10D 89/911
See application file for complete search history.

(56) References Cited

U.S. PATENT DOCUMENTS 7,446,991 B2 * 11/2008 Chen .................... H10D 89/819 361/56
2010/0193907 A1 * 8/2010 Crawley ................ H10D 1/692 257/532
2016/0163692 A1 * 6/2016 Moghe ..................... H10D 1/68 257/503
2019/0393194 A1 12/2019 Chen et al.
2020/0373293 A1 * 11/2020 Baek ...................... H10D 30/60
(Continued)

FOREIGN PATENT DOCUMENTS

TW 200539468 A 12/2005
TW 202230707 A 8/2022

OTHER PUBLICATIONS

Ming-Dou Ker, et al. "Capacitor-couple ESD protection circuit for deep-submicron low-voltage CMOS ASIC." IEEE Transactions on Very Large Scale Integration (VLSI) Systems, vol. 4, No. 3, Sep. 1996, pp. 307-321, https://doi.org/10.1109/92.532032. (Year: 1996).*
(Continued)

*Primary Examiner* — J. E. Schoenholtz
(74) *Attorney, Agent, or Firm* — Foley & Lardner LLP

(57) ABSTRACT

A circuit includes an electrostatic discharge protection circuit disposed along a major surface of a substrate, an internal circuit also disposed along the major surface but laterally spaced from the electrostatic discharge protection circuit, and a coupling capacitor operatively coupled and physically disposed between the electrostatic discharge protection circuit and the internal circuit. The coupling capacitor includes a first metal element formed in a first one of a plurality of metallization layers disposed over the major surface, and a second metal element also formed in the first metallization layer. A number of the metallization layers vertically disposed between the first metallization layer and the major surface is equal to or less than 1.

20 Claims, 10 Drawing Sheets

(56) References Cited

U.S. PATENT DOCUMENTS

| | | | | |
|---|---|---|---|---|
| 2021/0305802 | A1* | 9/2021 | Yeh | H02H 3/08 |
| 2024/0321866 | A1* | 9/2024 | Kang | H10D 89/819 |
| 2025/0167544 | A1* | 5/2025 | Wang | H02H 9/046 |

OTHER PUBLICATIONS

Office Action issued in Taiwan Appl. No. 113128893 dated Apr. 14, 2025.

* cited by examiner

PROTECTION OF INTEGRATED CIRCUIT FROM ESD AND PID RISKS

BACKGROUND

The present disclosure relates generally to integrated circuits (ICs), and particularly to protecting integrated circuits from Electrostatic Discharge ("ESD") or Plasma Induced Damage ("PID") risks or failures. Integrated circuits are widely used in a variety of applications. The reliability of these integrated circuits may be impacted by a variety of factors. Such factors may include e.g., an ESD event and a PID damage. A protection from ESD events and PID damages may be critical for the proper operation of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
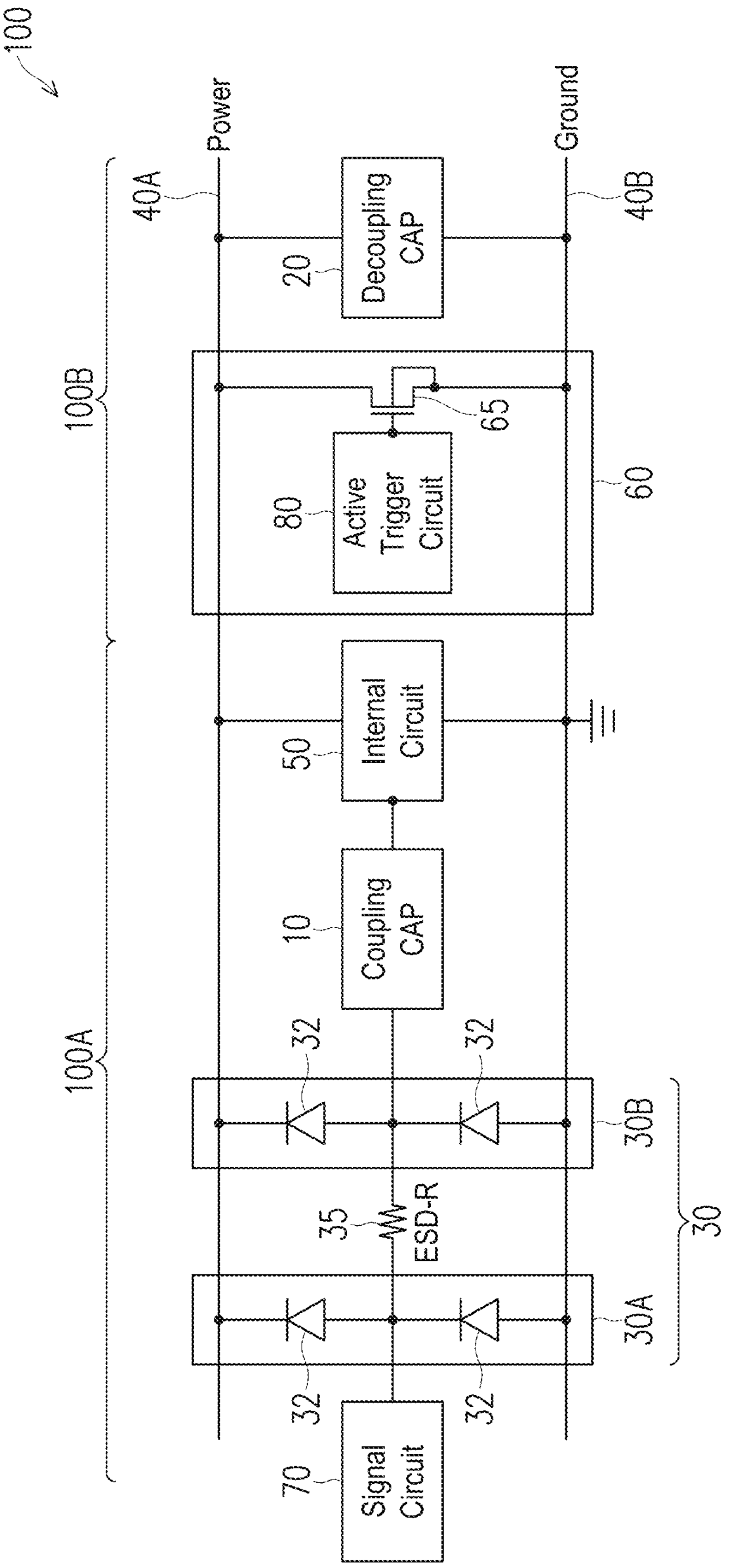
FIG. 1 is an example circuit diagram showing a general circuit including both an ESD/PID protection scheme for a coupling capacitor and an ESD/PID protection scheme or circuit for a decoupling capacitor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The reliability of these integrated circuits (ICs) may be impacted by a variety of factors. Such factors may include such as Electrostatic Discharge ("ESD") events and Plasma Induce Damage ("PID") risks. A protection of an integrated circuit from the ESD events and PID risks may be critical for the proper operation of the integrated circuit. An ESD event may cause a short sudden surge of electric charge within an integrated circuit, which may ultimately cause an integrated circuit to fail. Since ESD events may occur under a wide range of conditions, such as during fabrication, assembly, testing, and field operations, protection of an integrated circuit from ESD events is critical for the proper operation of the integrated circuit. A PID typically refers to the undesirable effects that can occur when plasma interacts with materials, particularly in semiconductor manufacturing processes. Plasma, which is a highly ionized gas, is commonly used in various stages of semiconductor fabrication for etching, deposition, and cleaning. PID can cause a reliability issue that affects all process generations.

The present disclosure provides various embodiments of a circuit. In some embodiments, a circuit includes an electrostatic discharge protection circuit disposed along a major surface of a substrate, an internal circuit also disposed along the major surface but laterally spaced from the electrostatic discharge protection circuit, and a coupling capacitor operatively coupled and physically disposed between the electrostatic discharge protection circuit and the internal circuit. The coupling capacitor includes a first metal element formed in a first one of a plurality of metallization layers disposed over the major surface; and a second metal element also formed in the first metallization layer. A number of the metallization layers vertically disposed between the first metallization layer and the major surface is equal to or less than 1.

In some embodiments, the electrostatic discharge protection circuit includes a first charge dissipation element and a second charge dissipation element. The first metal element is coupled to the first charge dissipation element, and the second metal element is coupled to a second charge dissipation element. In some embodiments, the coupling capacitor is a Metal-Oxide-Metal ("MOM") capacitor or a Metal-Insulator-Metal ("MIM") capacitor. The coupling capacitor is located between a signal output of a signal circuit and a signal input of the internal circuit for coupling them. There might be unbalance ESD or PID charge on the two metal plates of the coupling capacitor, which may result in an ESD or PID failure. In some embodiments, the two metal plates of the coupling capacitor are coupled to an ESD protection scheme or device at a lower metallization layer or level, and thus a leakage path can be created to discharge charges accumulated on the MOM or MIM metal plates of the coupling capacitor e.g., during a plasma processing. As such, the potential difference across the coupling capacitor caused by the plasma process is limited or eliminated, thereby advantageously reducing or eliminating PID risks or failures to the coupling capacitor, and thus improving the quality of the circuit.

In other embodiments, another circuit includes an electrostatic discharge clamp and a decoupling capacitor. The electrostatic discharge clamp is operatively coupled and physically disposed between a power rail and a ground rail, and includes a first charge dissipation element and a second charge dissipation element both disposed along a major surface of a substrate. The decoupling capacitor is operatively coupled and physically disposed between the power rail and the ground rail. The decoupling capacitor includes a first metal element formed in a first one of a plurality of metallization layers disposed over the major surface; and a second metal element also formed in the first metallization layer. In some embodiments, the first metal element is coupled to the first charge dissipation element, and the second metal element is coupled to a second charge dissipation element. A number of the metallization layers vertically disposed between the first metallization layer and the major surface is equal to or less than 1. As such, the potential difference across the decoupling capacitor caused by the plasma process is limited or eliminated, thereby advantageously reducing or eliminating PID risks or failures to the decoupling capacitor, and thus improving the quality of the circuit.

FIG. 1 is an example circuit diagram showing a general circuit 100 including both an ESD/PID protection scheme (or circuit) 100A for a coupling capacitor 10 and an ESD/PID protection scheme 100B (or circuit) for a decoupling capacitor 20 in accordance with some embodiments. In some embodiments, the coupling capacitor 10 or the decoupling capacitor 20 is a Metal-Oxide-Metal ("MOM") capacitor or a Metal-Insulator-Metal ("MIM") capacitor. MIM and MOM capacitors are both types of capacitors widely used in electronic circuits, particularly in integrated circuits (ICs).

In a MIM capacitor, the capacitor structure consists of a metal-insulator-metal stack. The insulator layer is typically made of a dielectric material such as silicon dioxide (SiO2), silicon nitride (Si3N4), or a high-k dielectric material. MIM capacitors are widely used in radio-frequency (RF) and analog integrated circuits due to their high capacitance density, low leakage current, and good high-frequency performance, and are often used in applications such as filters, oscillators, and impedance matching circuits. In a MOM capacitor, the capacitor structure consists of a metal-oxide-metal stack. The insulator layer is specifically an oxide layer, commonly silicon dioxide (SiO2) or a high-k dielectric material. MOM capacitors are also used in integrated circuits, particularly in analog and mixed-signal circuits, and offer advantages such as high capacitance density, good stability, and compatibility with standard CMOS processes. MOM capacitors find applications in various analog circuits, such as voltage references, filters, and amplifiers. Both MIM and MOM capacitors have their advantages and are chosen based on specific circuit requirements, process compatibility, and performance considerations.

Figure 3:
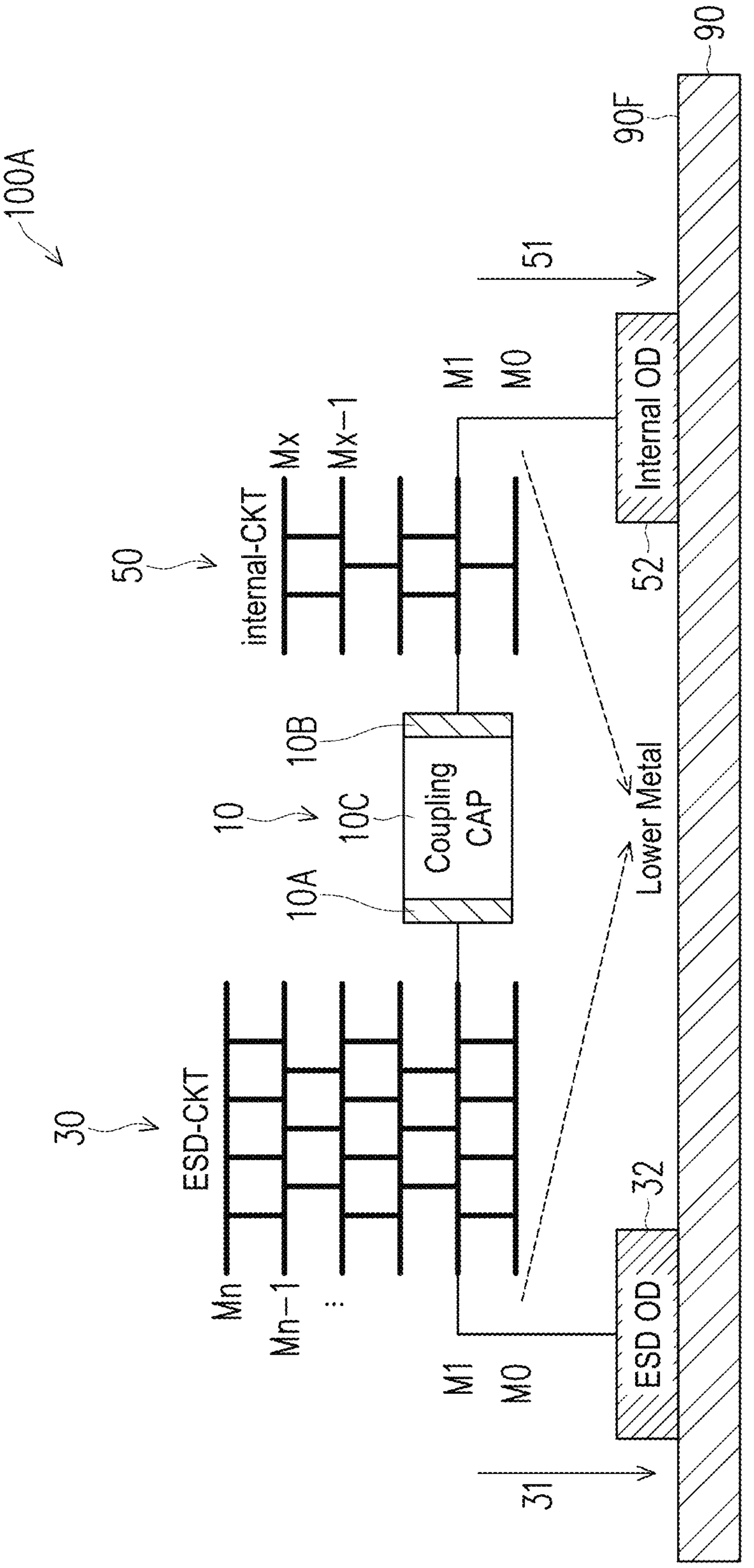
FIG. 3 is a cross-sectional view of the implementation of the ESD/PID protection scheme or circuit for the coupling capacitor as shown in FIG. 2 in accordance with some embodiments.

As shown in FIG. 1, in some embodiments, the ESD/PID protection circuit 100A includes a coupling capacitor 10 operatively coupled to and physically disposed between an electrostatic discharge protection circuit 30 and an internal circuit 50. In some embodiments, a the coupling capacitor 10 is operatively coupled between an output of a signal circuit 70 and an input of the internal circuit 50. In some embodiments, the signal circuit 70 includes the electrostatic discharge protection circuit 30 (e.g., as shown in FIG. 3). In some embodiments, the electrostatic discharge protection circuit 30 includes a primary electrostatic discharge protection circuit 30A and a secondary electrostatic discharge protection circuit 30B that are parallel with each other. In some embodiments, each of the primary electrostatic discharge protection circuit 30A and the secondary electrostatic discharge protection circuit 30B includes a dissipation element (such as a diode) 32, or two (as shown in FIG. 1) or more dissipation elements (such as diodes) 32 coupled in series. In some embodiments, the coupling capacitor 10 is operatively coupled to the signal circuit 70 through a resistor 35. In some embodiments, the electrostatic discharge protection circuit 30 and the internal circuit 50 are operatively coupled and physically disposed between a power rail 40A and a ground rail 40B.

In some embodiments, at an earlier stage of a fabricating process of the circuit 100A, a portion of a first metal plate (e.g., 10A in FIG. 2) of the coupling capacitor 10 is coupled to the electrostatic discharge protection circuit 30, and a portion of a second metal plate (e.g., 10B in FIG. 2) of the coupling capacitor 10 is coupled to a dissipation element of the internal circuit 50. As such, leakage paths for the coupling capacitor 10 are created at an earlier stage and at a lower metallization layer to discharge accumulated charges on the metal plates of the coupling capacitor 10 and thus limit the potential across the coupling capacitor 10, thereby advantageously reducing or eliminating ESD/PID risks or failures. More details about the ESD/PID protection circuit 100A for the coupling capacitor 10 will be described with respect to FIGS. 2-4.

Also as shown in FIG. 1, the ESD/PID protection circuit 100B includes a decoupling capacitor 20 operatively coupled and physically disposed between a power rail 40A and a ground rail 40B, and an electrostatic discharge clamp 60 also operatively coupled and physically disposed between the power rail 40A and the ground rail 40B. In some embodiments, the electrostatic discharge clamp 60 includes a transistor 65 (also in FIG. 9). In some embodiments, the electrostatic discharge clamp 60 includes a trigger device (or an activization trigger device) 80. In other embodiments, the electrostatic discharge clamp 60 is coupled to the trigger device 80.

In some embodiments, at an earlier stage of a fabricating process of the circuit 100B, at least portions of two metal plates (20A and 20B in FIG. 9) of the decoupling capacitor 20 are coupled to the electrostatic discharge clamp 60. As such, a leakage path for the decoupling capacitor 20 is created at an earlier stage and at a lower metallization layer (e.g., M0 or M1 in FIG. 10) to discharge accumulated charges on the metal plates of the decoupling capacitor 20 e.g., during a plasma processing, and thus can limit the potential across the decoupling capacitor 20, thereby advantageously reducing or eliminating ESD/PID risks or failures to the decoupling capacitor 20. More details about the ESD/PID protection circuit 100B for the decoupling capacitor 20 will be described with respect to FIGS. 9-11.

Figure 2:
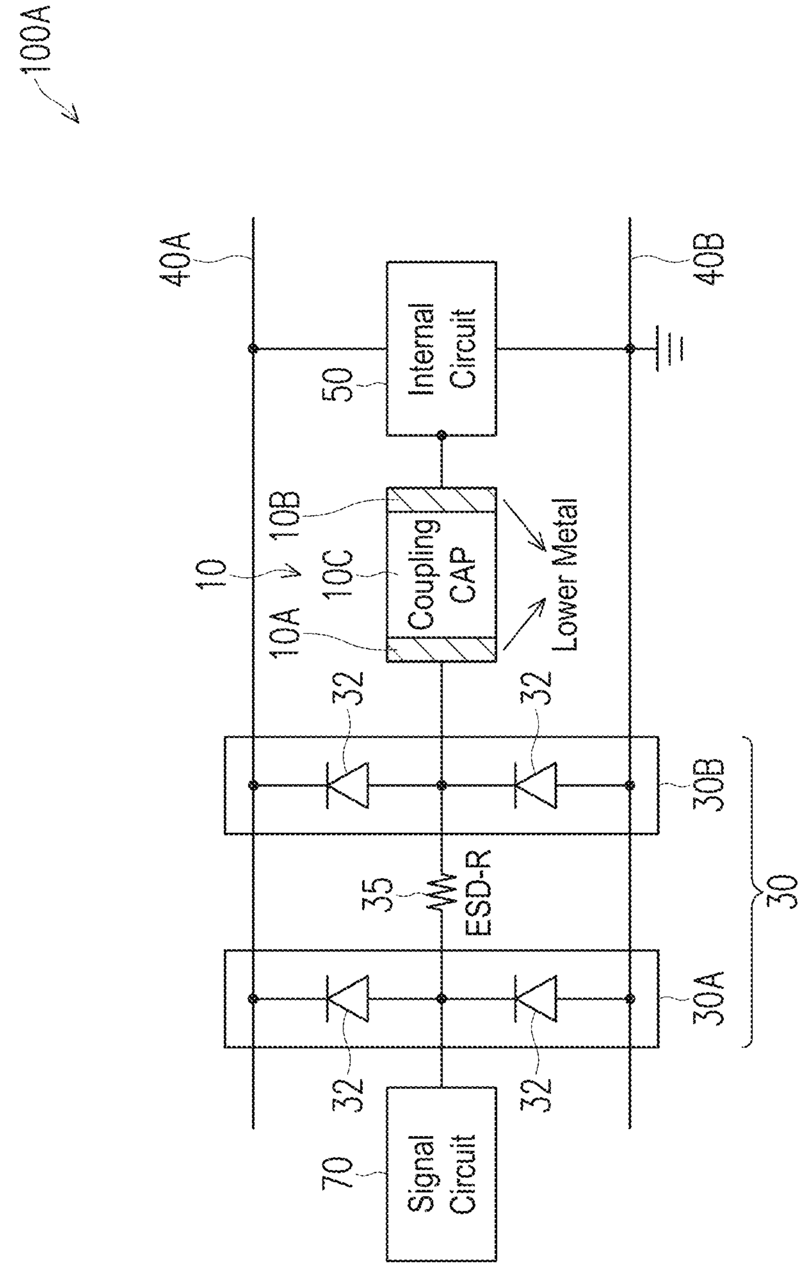
FIG. 2 is an example circuit diagram showing an implementation of the ESD/PID protection scheme or circuit for the coupling capacitor as shown in FIG. 1 in accordance with some embodiments.
Figure 4:
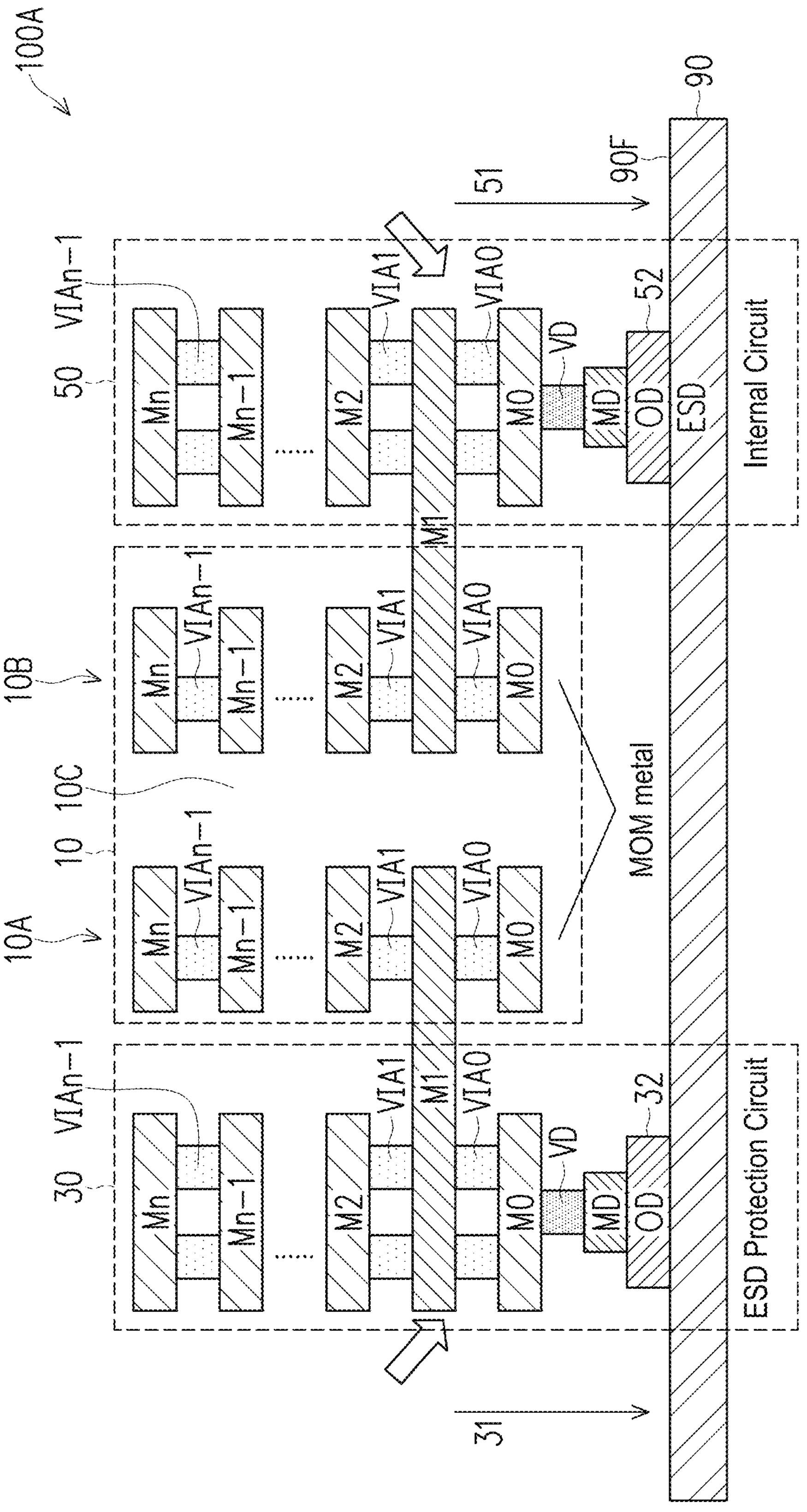
FIG. 4 is a more detailed cross-sectional view of the implementation of the ESD/PID protection scheme or circuit for the coupling capacitor as shown in FIG. 3 in accordance with some embodiments.

FIG. 2 is an example circuit diagram showing an implementation of the ESD/PID protection circuit 100A for the coupling capacitor 10 as shown in FIG. 1 in accordance with some embodiments. FIG. 3 is a cross-sectional view of the implementation of the ESD/PID protection circuit 100A for the coupling capacitor 10 as shown in FIG. 2 in accordance with some embodiments. FIG. 4 is a more detailed cross-sectional view of the implementation of the ESD/PID protection circuit 100A for the coupling capacitor 10 as shown in FIG. 3 in accordance with some embodiments.

As shown in FIGS. 2-4, in some embodiments, the ESD/PID protection circuit 100A includes an electrostatic discharge protection circuit 30 disposed along a major surface 90F of a substrate 90, an internal circuit 50 also disposed along the major surface 90F but laterally spaced from the electrostatic discharge protection circuit 30, and a coupling capacitor 10 operatively coupled and physically disposed between the electrostatic discharge protection circuit 30 and the internal circuit 50. The coupling capacitor 10 is a MIM or MOM capacitor, and includes a first metal plate 10A coupled to the electrostatic discharge protection circuit 30, a second metal plate 10B coupled to the internal circuit 50, and a dielectric material 10C between them.

As shown in FIG. 3, the electrostatic discharge protection circuit 30 is disposed within a plurality of metallization layers (such as M0, M1, M2, and Mn) over the major surface 90F of the substrate 90, and includes a first dissipation element 32 disposed along the major surface 90F of the substrate 90. The internal circuit 50 is disposed within a plurality of metallization layers (such as M0, M1, M2, . . . and Mx) also over the major surface 90F but laterally spaced from the electrostatic discharge protection circuit 30, and includes a second dissipation element 52 disposed along the major surface 90F of the substrate 90. In some embodiments, the first dissipation element 32 is an active ESD channel (OD), and the second dissipation element 52 is an active internal channel (OD). The coupling capacitor 10 is physically disposed between the electrostatic discharge protection circuit 30 and the internal circuit 50, and includes a first metal plate 10A, a second metal plate 10B, and a dielectric material 10C between them.

Also as shown in FIG. 3, in some embodiments, the first metal plate 10A is coupled to the first dissipation element 32 of the electrostatic discharge protection circuit 30, and the second metal plate 10B is coupled to the second dissipation element 32 of the internal circuit 50, both at a lower metallization layer (e.g., M1). As such, leakage paths 31 and 51 for the metal plates 10A and 10B of the coupling capacitor 10 are created at an earlier stage and at a lower metallization layer to discharge accumulated charges on the metal plates 10A and 10B, and thus can limit the potential across the coupling capacitor 10, thereby advantageously reducing or eliminating ESD/PID risks or failures to the coupling capacitor 10.

As shown in FIG. 4, the electrostatic discharge protection circuit 30 includes a plurality of metallization layers (such as M0, M1, M2, . . . and Mn) disposed over the major surface 90F of the substrate 90, and a first dissipation element 32 disposed along the major surface 90F of the substrate 90. The internal circuit 50 includes a plurality of metallization layers (such as M0, M1, M2, . . . and Mn) also disposed over the major surface 90F but laterally spaced from the electrostatic discharge protection circuit 30, and a second dissipation element 52 disposed along the major surface 90F of the substrate 90. In some embodiments, the first dissipation element 32 is an active ESD channel (OD), and the second dissipation element 52 is an active internal channel (OD). The coupling capacitor 10 is physically disposed between the electrostatic discharge protection circuit 30 and the internal circuit 50, and includes a first metal plate 10A, a second metal plate 10B, and a dielectric material 10C between them. The first metal plate 10A includes a plurality of first metal elements respectively within a plurality of metallization layers (such as M0, M1, M2, . . . and Mn) disposed over the major surface 90F of the substrate 90, and the second metal plate 10B includes a plurality of second metal elements respectively in a plurality of metallization layers (such as M0, M1, M2, . . . and Mn) disposed over the major surface 90F of the substrate 90. In some embodiments, the first metal elements include metal lines and/or metal vias, coupled to each other and collectively functioning as the first metal plate 10A of the coupling capacitor 10, and the second metal elements include metal lines and/or metal vias, coupled to each other and collectively functioning as the second metal plate 10B of the coupling capacitor 10.

In some embodiments, the first metal plate 10A is coupled to the first dissipation element 32 of the electrostatic discharge protection circuit 30 at the lowest metallization layer (e.g., M0) through first metal elements (e.g., M0, VD, and MD), and the second metal plate 10B is coupled to the second dissipation element (e.g., OD) 52 of the internal circuit 50 also at the lowest metallization layer (e.g., M0) through second metal elements (e.g., M0, VD, and MD), not shown in FIG. 4.

In other embodiments, as shown in FIG. 4, the first metal plate 10A is coupled to the first dissipation element 32 of the electrostatic discharge protection circuit 30 at a lower metallization layer (e.g., M1) adjacent to the lowest metallization layer (e.g., M0) through first metal elements (e.g., M1, VIA0, M0, VD, and MD), and the second metal plate 10B is coupled to the second dissipation element 52 of the internal circuit 50 also at the lower metallization layer (e.g., M1) adjacent to the lowest metallization layer (e.g., M0) through second metal elements (e.g., M1, VIA0, M0, VD, and MD).

Figure 5:
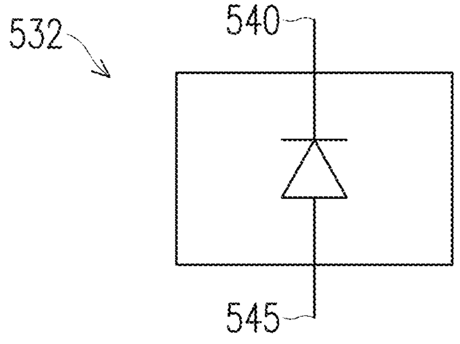
FIG. 5-8 are example charge dissipation elements for use in the ESD protection circuits of FIGS. 1-4 in accordance with some embodiments.

FIG. 5-8 are example charge dissipation elements (e.g., 32 in FIG. 2) for use in the ESD protection circuits of FIGS. 1-4 in accordance with some embodiments. In some embodiments and as shown in FIG. 5, a charge dissipation element may be configured as a reverse diode 532 that includes a cathode terminal 540 and an anode terminal 545. In some embodiments, the cathode terminal 540 is connected to the first metal plate (e.g., 10A in FIG. 2), and the anode terminal 545 is connected to the ground rail (e.g., 40B in FIG. 2). In other embodiments, the cathode terminal 540 is connected to the power rail (e.g., 40A in FIG. 2), and the anode terminal 545 is connected to the first metal plate (e.g., 10A in FIG. 2).

Figure 6:
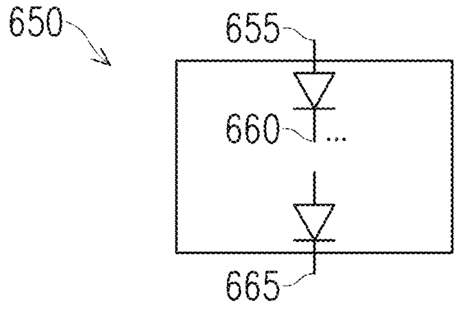

In some embodiments and as shown in FIG. 6, the charge dissipation element may be configured as a series of diodes 650. The number of diodes in the series of diodes 650 may vary from one embodiment to another. In some embodiments, the number of diodes in the series of diodes 650 may be dependent upon the amount of residual charge that is desired to be dissipated. Further, in some embodiments, the string of diodes 650 may be connected such that an anode terminal 655 of the first diode in the series of diodes 650 is connected to the ground rail (e.g., 40B in FIG. 2), and a cathode terminal 660 of the first diode is connected to the anode terminal of the next diode (e.g., second diode) in the series. The cathode of the second diode may be connected to the anode of the third diode in the series, and so on. A cathode terminal 665 of the last diode in the series of diodes 650 may be connected to the power rail (e.g., 40A in FIG. 2).

Figure 7:
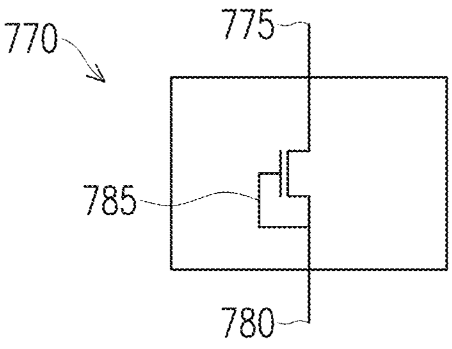
Figure 8:
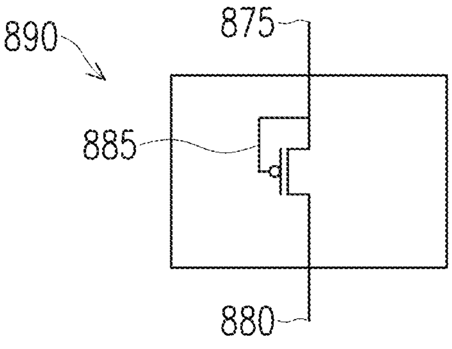

In some embodiments and as shown in FIG. 7, the charge dissipation element may be configured as an NMOS diode 770. The NMOS diode 770 may include a first terminal (e.g., drain terminal) 775, a second terminal (e.g., a source terminal) 780, and a third terminal (e.g., a gate terminal) 785. In other embodiments and as shown in FIG. 8, the charge dissipation element may be configured as a PMOS diode 890. The PMOS diode 890 may include a first terminal (e.g., drain terminal) 875, a second terminal (e.g., a source terminal) 880 and a third terminal (e.g., a gate terminal) 885.

Figure 9:
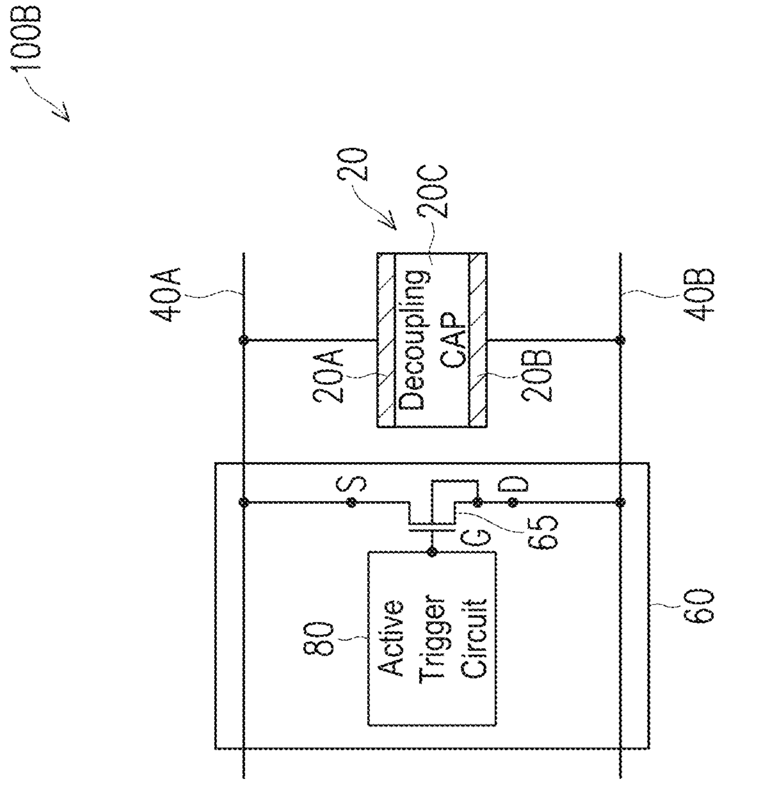
FIG. 9 is an example circuit diagram showing an implementation of the ESD/PID protection scheme or circuit for the decoupling capacitor as shown in FIG. 1 in accordance with some embodiments.
Figure 10:
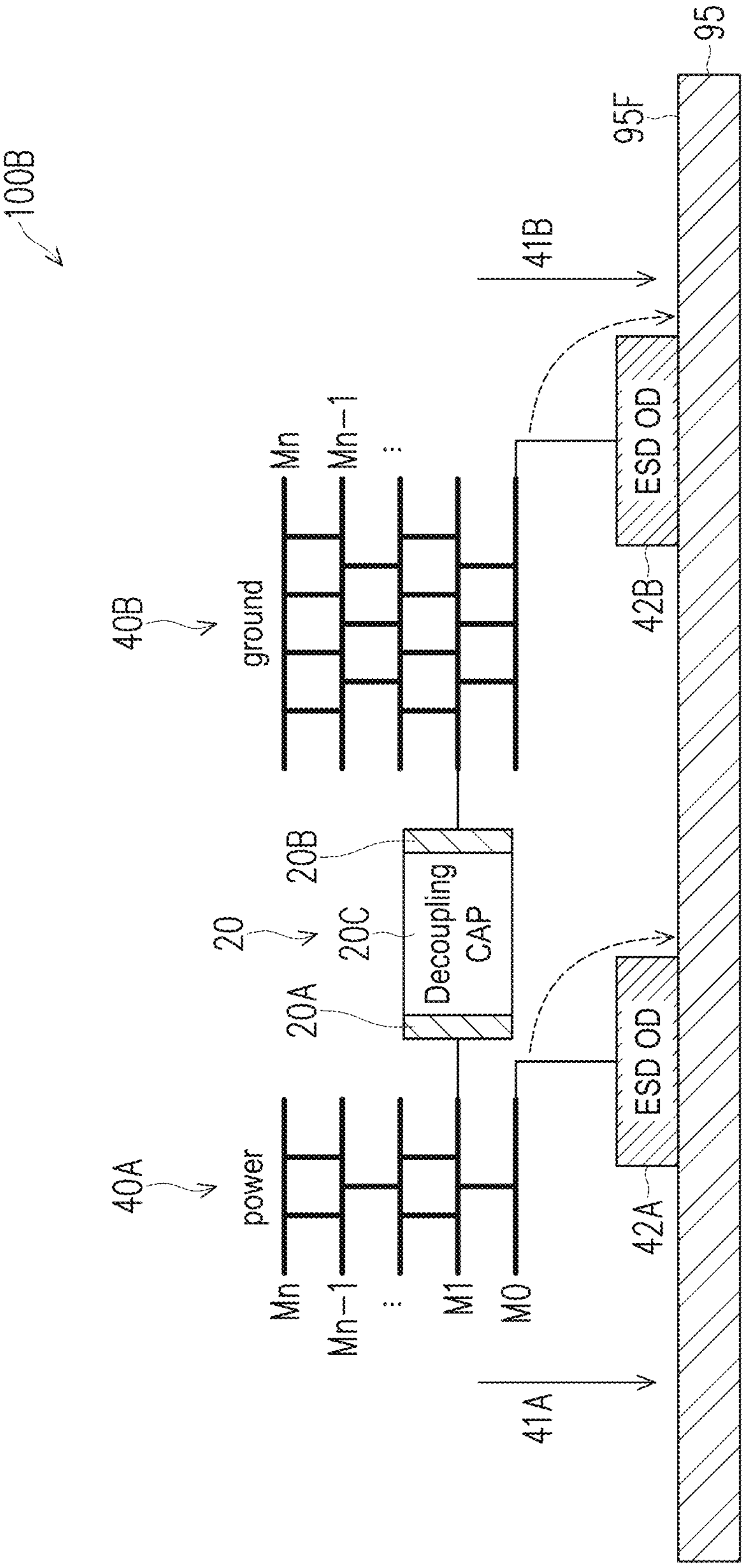
FIG. 10 is a cross-sectional view of the implementation of the ESD/PID protection scheme or circuit for the decoupling capacitor as shown in FIG. 9 in accordance with some embodiments.
Figure 11:
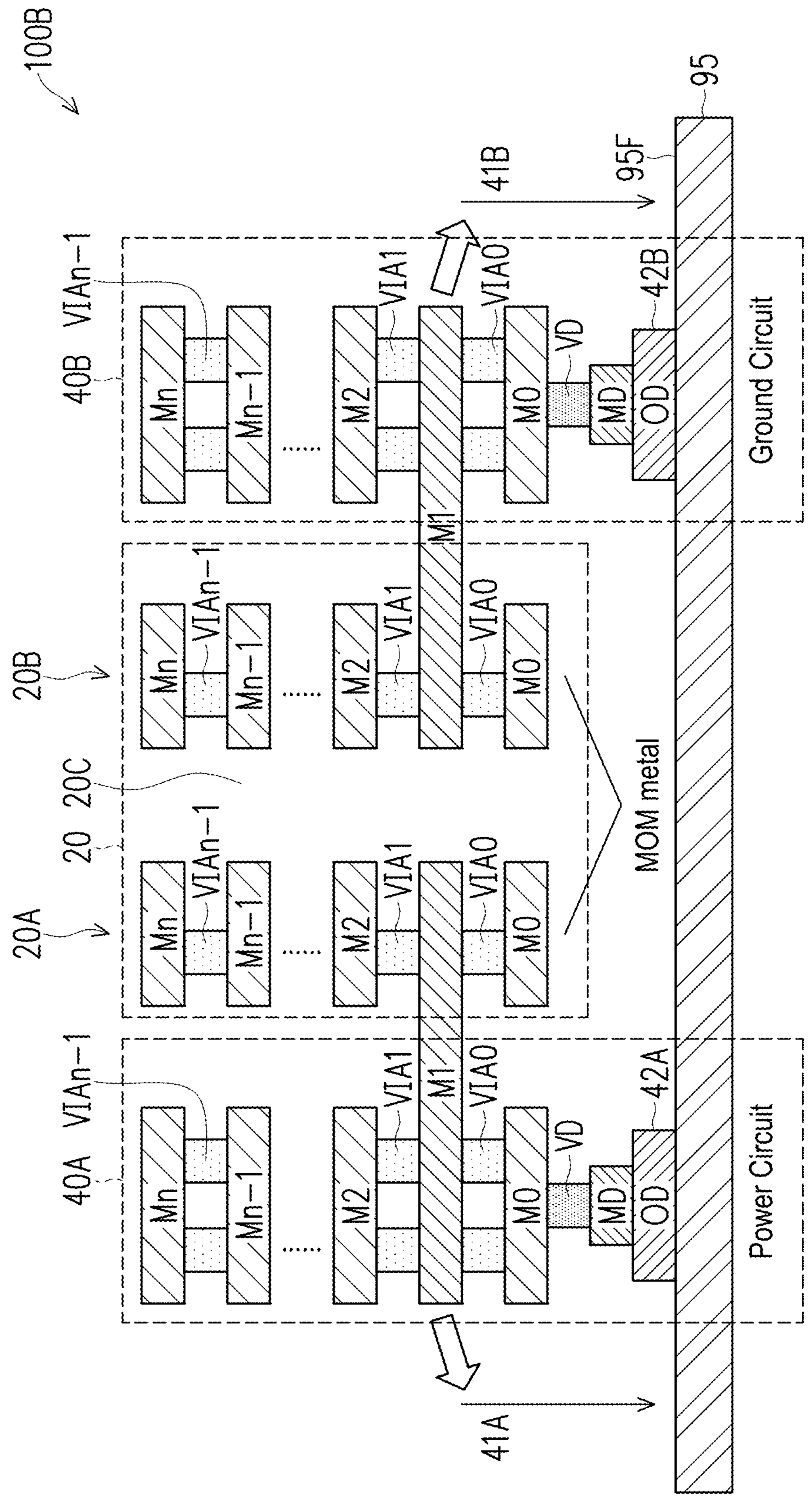
FIG. 11 is a more detailed cross-sectional view of the implementation of the ESD/PID protection scheme or circuit for the decoupling capacitor as shown in FIG. 10 in accordance with some embodiments.

FIG. 9 is an example circuit diagram showing an example implementation of the ESD/PID protection circuit 100B for the decoupling capacitor 20 as shown in FIG. 1 in accordance with some embodiments. FIG. 10 is a cross-sectional view of the implementation of the ESD/PID protection circuit 100B for the decoupling capacitor 20 as shown in FIG. 9 in accordance with some embodiments. FIG. 11 is a more detailed cross-sectional view of the implementation of the ESD/PID protection circuit 100B for the decoupling capacitor 20 as shown in FIG. 10 in accordance with some embodiments.

As shown in FIGS. 9-11, in some embodiments, the ESD/PID protection circuit 100B includes an electrostatic discharge clamp 60 operatively coupled and physically disposed between a power rail 40A and a ground rail 40B, a decoupling capacitor 20 also operatively coupled and physically disposed between the power rail 40A and the ground rail 40B. As shown in FIG. 10, in some embodiments, the ESD/PID protection circuit 100B further includes a trigger device 80 that is configured to detect an electrostatic discharge (ESD) event or a plasma induced damage (PID) event, and is configured to activate the electrostatic discharge clamp 60 in response to a detected electrostatic discharge (ESD) event or plasma induced damage (PID) event. In some embodiments, the electrostatic discharge clamp 60 includes a transistor 65 that includes a first terminal (e.g., source) S connected to the power rail 40A, a second terminal (e.g., drain) D connected to the ground rail 40B, and a third terminal (e.g., gate) G connected to an output of the trigger device 80.

As shown in FIGS. 10-11, in some embodiments, the electrostatic discharge clamp 60 includes a first charge dissipation element 42A and a second charge dissipation element 42B, both disposed along a major surface 95F of a substrate 95. In some embodiments, each of the first charge dissipation element 42A and the second charge dissipation element 42B includes one of a reverse diode, an NMOS diode, or a PMOS diode.

In some embodiments, as shown in FIG. 10, the first charge dissipation element 42A includes (or is coupled to) an active region (OD) of the power rail 40A, and the second charge dissipation element 42B includes (or is coupled to) an active region (OD) of the ground rail 40B.

In other embodiments, the first charge dissipation element 42A is an active region (such as a source region "S" in FIG. 9) of the electrostatic discharge clamp 60, and the second charge dissipation element 42B is another active region (such as a drain region "D" in FIG. 9) of the electrostatic discharge clamp 60.

As shown in FIG. 10, the power rail (or circuit) 40A includes a plurality of metallization layers (such as M0, M1, M2, . . . and Mn) disposed over a major surface 95F of the substrate 95, and a first dissipation element 42A disposed along the major surface 95F of the substrate 95. The ground rail (or circuit) 40B includes a plurality of metallization layers (such as M0, M1, M2, and Mn) also disposed over the major surface 95F of the substrate 95, and a second dissipation element 42B also disposed along the major surface 95F of the substrate 95.

In some embodiments, the first dissipation element 42A is an active ESD channel (OD) of the power circuit 40A, and the second dissipation element 42B is an active ESD channel (OD) of the ground circuit 40B. The decoupling capacitor 20 is physically disposed between the power circuit 40A and the ground circuit 40B, and includes a first metal plate 20A, a second metal plate 20B, and dielectric material 20C between them.

Also as shown in FIG. 10, in some embodiments, the first metal plate 20A of the decoupling capacitor 20 is coupled to the first dissipation element 42A of the power circuit 40A, and the second metal plate 20B of the decoupling capacitor 20 is coupled to the second dissipation element 42B of the ground circuit 40B, both at a lower metallization layer (e.g., M1) of plurality of metallization layers (such as M0, M1, M2, . . . and Mn). As such, leakage paths 41A and 41B for the metal plates 20A and 20B of the decoupling capacitor 20 are created at an earlier fabrication stage of the circuit 100B and at a lower metallization layer to discharge accumulated charges on the metal plates 20A and 20B, and thus can limit the potential across the decoupling capacitor 20, thereby advantageously reducing or eliminating ESD/PID risks or failures to the decoupling capacitor 20.

As shown in FIG. 11, the power circuit 40A includes a plurality of metallization layers (such as M0, M1, M2, and Mn) disposed over the major surface 95F of the substrate 95, and a first dissipation element 42A disposed along the major surface 95F of the substrate 95. The ground circuit 40B includes a plurality of metallization layers (such as M0, M1, M2, and Mn) also disposed over the major surface 95F but laterally spaced from the power circuit 40A, and a second dissipation element 42B disposed along the major surface 95F of the substrate 95. In some embodiments, the first dissipation element 42A is an active ESD channel (OD) of the power circuit 40A, and the second dissipation element 42B is an active ESD channel (OD) of the ground circuit 40B. The decoupling capacitor 20 is physically disposed between the power circuit 40A and the ground circuit 40B, and includes a first metal plate 20A, a second metal plate 20B, and a dielectric material 20C between them. The first metal plate 20A includes a plurality of first metal elements respectively in a plurality of metallization layers (such as M0, M1, M2, . . . and Mn) disposed over the major surface 95F of the substrate 95, and the second metal plate 20B includes a plurality of second metal elements respectively in a plurality of metallization layers (such as M0, M1, M2, . . . and Mn) disposed over the major surface 95F of the substrate 95. In some embodiments, the first metal elements include metal lines and/or metal vias and collectively function as the first metal plate 20A of the decoupling capacitor 20, and the second metal elements include metal lines and/or metal vias and collectively function as the second metal plate 20B of the decoupling capacitor 20.

In some embodiments, the first metal plate 20A of the decoupling capacitor 20 is coupled to the first dissipation element (e.g., OD) 42A of the power circuit 40A at the lowest metallization layer (e.g., M0) through first metal elements (e.g., M0, VD, and MD), and the second metal plate 20B of the decoupling capacitor 20 is coupled to the second dissipation element (e.g., OD) 42B of the ground circuit 40B also at the lowest metallization layer (e.g., M0) through second metal elements (e.g., M0, VD, and MD), not shown in FIG. 11.

In other embodiments, as shown in FIG. 11, the first metal plate 20A of the decoupling capacitor 20 is coupled to the first dissipation element 42A of the power circuit 40A at a lower metallization layer (e.g., M1) adjacent to the lowest metallization layer (e.g., M0) through first metal elements (e.g., M1, VIA0, M0, VD, and MD), and the second metal plate 20B of the decoupling capacitor 20 is coupled to the second dissipation element 42B of the ground circuit 40B also at the lower metallization layer (e.g., M1) adjacent to the lowest metallization layer (e.g., M0) through second metal elements (e.g., M1, VIA0, M0, VD, and MD).

As such, leakage paths 41A and 41B for the first metal plate 20A and the second metal plate 20B of the decoupling capacitor 20 are created at an earlier fabrication stage and at a lower metallization layer to discharge accumulated charges thereon, and thus can limit the potential across the decoupling capacitor 20, thereby advantageously reducing or eliminating ESD/PID risks or failures to the decoupling capacitor 20.

Figure 12:
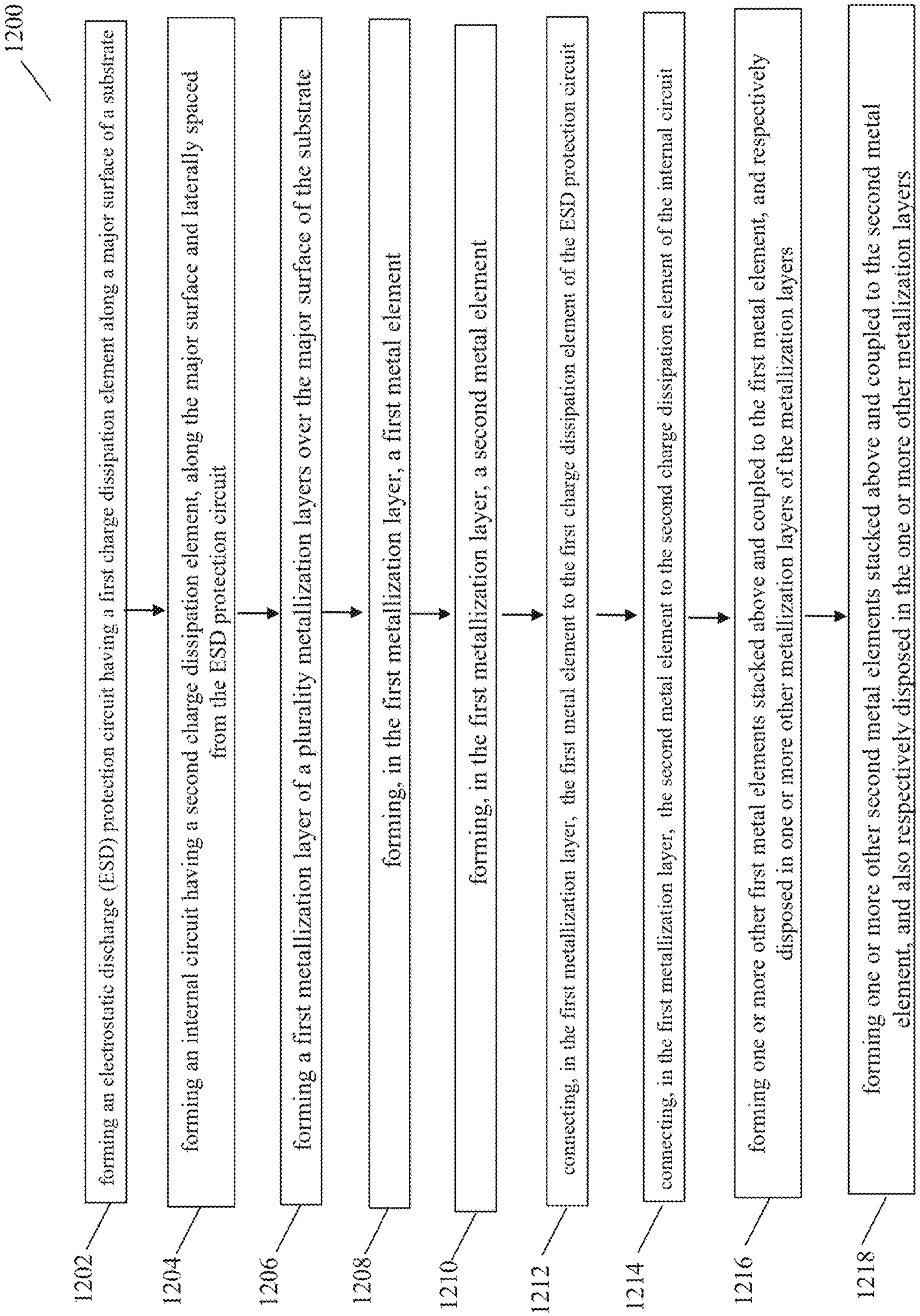
FIG. 12 is an example flowchart of a method of manufacturing the circuit in FIG. 2 accordance with some embodiments.

FIG. 12 is an example flowchart of a method of manufacturing the circuit 100A in FIGS. 2-4 accordance with some embodiments. It should be noted that the method 1200 is merely an example, and is not intended to limit the present disclosure. Accordingly, it is understood that the order of operation of the method 1200 of FIG. 12 can change, that additional operations may be provided before, during, and after the method 1200 of FIG. 12, and that some other operations may only be described briefly herein.

As shown in FIGS. 2-4, such a circuit 100A fabricated by the method 1200 may include an electrostatic discharge protection circuit 30 having a first charge dissipation element 32 disposed along a major surface 90F of a substrate 90, an internal circuit 50 having a second charge dissipation element 52 also disposed along the major surface 90 and laterally spaced from the electrostatic discharge protection circuit 30, and a coupling capacitor 10 laterally disposed between the electrostatic discharge protection circuit 30 and the internal circuit 50. In some embodiments, each of the first charge dissipation element 32 and the second charge dissipation element 52 is selected from a reverse diode, an NMOS diode, or a PMOS diode. The coupling capacitor 10 includes a first metal plate 10A and a second metal plate 10B both vertically disposed within a plurality of metallization layers (such as M0, M1, M2, Mn) over the major surface 90.

Referring to FIGS. 2-4 and 12, the method 1200 starts with operation 1202 of forming an electrostatic discharge (ESD) protection circuit 30 having a first charge dissipation element 32 along a major surface 90F of a substrate 90.

Next, referring to FIGS. 2-4 and 12, the method 1200 proceeds to operation 1204 of forming an internal circuit 50 having a second charge dissipation element 52, along the major surface 90F and laterally spaced from the ESD protection circuit.

Next, referring to FIGS. 2-4 and 12, the method 1200 proceeds to operation 1206 of forming a first metallization layer (such as M0 or M1) of a plurality metallization layers e.g., M0, M1, M2, Mn) over the major surface 90F of the substrate 90.

Next, referring to FIGS. 2-4 and 12, the method 1200 proceeds to operation 1208 of forming, in the first metallization layer, a first metal element. The first metal element is configured as a portion of the first metal plate 10A of the coupling capacitor 10.

Next, referring to FIGS. 2-4 and 12, the method 1200 proceeds to operation 1210 of forming, in the first metallization layer, a second metal element. The second metal element is configured as a portion of the second metal plate 10B of the coupling capacitor 10.

Next, referring to FIGS. 2-4 and 12, the method 1200 proceeds to operation 1212 of connecting, in the first metallization layer, the first metal element to the first charge dissipation element 32 of the ESD protection circuit 30.

Next, referring to FIGS. 2-4 and 12, the method 1200 proceeds to operation 1214 of connecting, in the first metallization layer, the second metal element to the second charge dissipation element 52 of the internal circuit 50.

Next, referring to FIGS. 2-4 and 12, the method 1200 proceeds to operation 1216 of forming one or more other first metal elements stacked above and coupled to the first metal element, and respectively disposed in one or more other metallization layers of the metallization layers, and thus the first metal element and the other first metal elements are collectively configured to serve as a first metal plate 10A of a capacitor 10.

Next, referring to FIGS. 2-4 and 12, the method 1200 proceeds to operation 1218 of forming one or more other second metal elements stacked above and coupled to the second metal element, and also respectively disposed in the one or more other metallization layers, and thus the second metal element and the other second metal elements are collectively configured to serve as a second metal plate 10B of the capacitor 10.

As such, leakage paths 31 and 51 in FIG. 3 can also be used to discharge accumulated charges on the portions of the first metal plate 10A and the second metal plate 10B that are formed within the upper metallization layers (such as M2, M3, . . . Mn) above the lower metallization layer (such as M0 or M1) and thus can limit the potential across the coupling capacitor 10, thereby advantageously reducing or eliminating ESD/PID risks or failures to the coupling capacitor 10. In some embodiments, a number of the metallization layers vertically disposed between the first metallization layer (e.g., M0 or M1) and the major surface 90F of the substrate 90 is equal to or less than 1.

In accordance with some aspects of the present disclosure, a circuit is disclosed. The circuit includes an electrostatic discharge protection circuit disposed along a major surface of a substrate, an internal circuit also disposed along the major surface but laterally spaced from the electrostatic discharge protection circuit, and a coupling capacitor operatively coupled and physically disposed between the electrostatic discharge protection circuit and the internal circuit. The coupling capacitor includes a first metal element formed in a first one of a plurality of metallization layers disposed over the major surface, and a second metal element also formed in the first metallization layer. A number of the metallization layers vertically disposed between the first metallization layer and the major surface is equal to or less than 1.

In accordance with some other aspects of the present disclosure, another circuit is disclosed. The circuit includes an electrostatic discharge clamp including a first charge dissipation element and a second charge dissipation element, disposed along a major surface of a substrate, and operatively coupled and physically disposed between a power rail and a ground rail; and a decoupling capacitor operatively coupled and physically disposed between the power rail and the ground rail. The decoupling capacitor includes a first metal element formed in a first one of a plurality of metallization layers disposed over the major surface, and a second metal element also formed in the first metallization layer. A number of the metallization layers vertically disposed between the first metallization layer and the major surface is equal to or less than 1.

In accordance with yet other aspects of the present disclosure, a method of manufacturing a circuit is disclosed. The circuit includes a coupling capacitor having a first metal plate and a second metal plate respectively disposed within a plurality of metallization layers that are disposed over a major surface of a substrate. The method includes: forming an electrostatic discharge protection circuit along the major surface of the substrate, wherein the electrostatic discharge protection circuit comprises a first charge dissipation element; forming an internal circuit also along the major surface of the substrate, wherein the internal circuit comprises a second charge dissipation element; forming a first metal element in a first metallization layer of the metallization layers, configured as a portion of the first metal plate of the capacitor; forming a second metal element also in the first metallization layer, configured as a portion of the second metal plate of the capacitor; connecting the first metal element to the first charge dissipation element of the electrostatic discharge protection circuit; and connecting the second metal element to the second charge dissipation element of the internal circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
- an electrostatic discharge protection circuit disposed along a major surface of a substrate;
- an internal circuit also disposed along the major surface but laterally spaced from the electrostatic discharge protection circuit; and
- a coupling capacitor operatively coupled and physically disposed between the electrostatic discharge protection circuit and the internal circuit;
- wherein the coupling capacitor comprises:
  - a first metal element formed in a first one of a plurality of metallization layers disposed over the major surface; and
  - a second metal element also formed in the first metallization layer, wherein a number of the metallization layers vertically disposed between the first metallization layer and the major surface is equal to or less than 1.

2. The circuit of claim 1, wherein the capacitor is disposed between an output of a signal circuit and an input of the internal circuit.

3. The circuit of claim 1, wherein the electrostatic discharge protection circuit comprises:
- a first charge dissipation element; and
- a second charge dissipation element,
- wherein the first metal element is coupled to the first charge dissipation element, and wherein the second metal element is coupled to a second charge dissipation element.

4. The circuit of claim 3, wherein each of the first charge dissipation element is selected from a group consisting of a reverse diode, an NMOS diode, or a PMOS diode.

5. The circuit of claim 3, wherein each of the second charge dissipation element is selected from a group consisting of a reverse diode, an NMOS diode, or a PMOS diode.

6. The circuit of claim 1, wherein the capacitor further comprises:
- one or more other first metal elements stacked above and coupled to the first metal element, and respectively disposed in one or more other metallization layers of the metallization layers, wherein the first metal element and the other first metal elements are collectively configured to serve as a first metal plate of the coupling capacitor; and
- one or more other second metal elements stacked above and coupled to the second metal element, and also respectively disposed in the one or more other metallization layers, wherein the second metal element and the other second metal elements are collectively configured to serve as a second metal plate of the coupling capacitor.

7. The circuit of claim 6, wherein each of the first metal element and the other first metal elements comprises a metal line or a metal via.

8. The circuit of claim 6, wherein each of the second metal element and the other second metal elements comprises a metal line or a metal via.

9. A circuit, comprising:
- an electrostatic discharge clamp comprising a first charge dissipation element and a second charge dissipation element, disposed along a major surface of a substrate, and operatively coupled and physically disposed between a power rail and a ground rail; and
- a decoupling capacitor operatively coupled and physically disposed between the power rail and the ground rail;
- wherein the decoupling capacitor comprises:
  - a first metal element formed in a first one of a plurality of metallization layers disposed over the major surface; and
  - a second metal element also formed in the first metallization layer, wherein a number of the metallization layers vertically disposed between the first metallization layer and the major surface is equal to or less than 1.

10. The circuit of claim 9, wherein the first metal element is coupled to the first charge dissipation element, and wherein the second metal element is coupled to a second charge dissipation element.

11. The circuit of claim 9, further comprising:
- a trigger device configured to activate the electrostatic discharge clamp in response to an electrostatic discharge (ESD) event or a plasma induced damage (PID) event.

12. The circuit of claim 11, wherein the electrostatic discharge clamp comprises a transistor comprising a first terminal connected to the power rail, a second terminal connected to the ground rail, and a third terminal connected to an output of the trigger device.

13. The circuit of claim 9, wherein the first charge dissipation element comprises one of a reverse diode, an NMOS diode, or a PMOS diode.

14. The circuit of claim 9, wherein the second charge dissipation element comprises one of a reverse diode, an NMOS diode, or a PMOS diode.

15. The circuit of claim 9, wherein the capacitor further comprises:

one or more other first metal elements stacked above and coupled to the first metal element, and respectively disposed in one or more other metallization layers of the metallization layers, wherein the first metal element and the other first metal elements are collectively configured to serve as a first metal plate of the coupling capacitor; and one or more other second metal elements stacked above and coupled to the second metal element, and also respectively disposed in the one or more other metallization layers, wherein the second metal element and the other second metal elements are collectively configured to serve as a second metal plate of the coupling capacitor.

16. The circuit of claim 9, wherein each of the first metal element and the other first metal elements comprises a metal line or a metal via.

17. The circuit of claim 9, wherein each of the second metal element and the other second metal elements comprises a metal line or a metal via.

18. A method of manufacturing a circuit, comprising:

forming an electrostatic discharge (ESD) protection circuit having a first charge dissipation element along a major surface of a substrate;

forming an internal circuit having a second charge dissipation element, along the major surface and laterally spaced from the ESD protection circuit;

forming a first metallization layer of a plurality metallization layers over the major surface of the substrate;

forming, in the first metallization layer, a first metal element;

forming, in the first metallization layer, a second metal element;

connecting, in the first metallization layer, the first metal element to the first charge dissipation element of the ESD protection circuit;

connecting, in the first metallization layer, the second metal element to the second charge dissipation element of the internal circuit;

forming one or more other first metal elements stacked above and coupled to the first metal element, and respectively disposed in one or more other metallization layers of the metallization layers, wherein the first metal element and the other first metal elements are collectively configured to serve as a first metal plate of a capacitor; and forming one or more other second metal elements stacked above and coupled to the second metal element, and also respectively disposed in the one or more other metallization layers, wherein the second metal element and the other second metal elements are collectively configured to serve as a second metal plate of the capacitor.

19. The method of claim 18, wherein a number of the metallization layers vertically disposed between the first metallization layer and the major surface is equal to or less than 1.

20. The method of claim 19, wherein each of the first charge dissipation element and the second charge dissipation element is selected from a group consisting of a reverse diode, an NMOS diode, or a PMOS diode.

* * * * *